United States Patent [19]

Dennison et al.

[11] Patent Number: 5,236,855
[45] Date of Patent: Aug. 17, 1993

[54] STACKED V-CELL CAPACITOR USING A DISPOSABLE OUTER DIGIT LINE SPACER

[75] Inventors: Charles H. Dennison; Pierre C. Fazan; Ruojia Lee; Yauh-Ching Liu, all of Boise, Id.

[73] Assignee: Micron Technology, Inc., Boise, Id.

[21] Appl. No.: 610,493

[22] Filed: Nov. 6, 1990

[51] Int. Cl.⁵ .................... H01L 21/70; H01L 21/265
[52] U.S. Cl. ........................... 437/47; 437/52; 437/60; 437/919
[58] Field of Search .............. 437/48, 49, 52, 60, 437/919, 47; 357/23.6, 51; 257/301-316; 365/149, 185

[56] References Cited

U.S. PATENT DOCUMENTS

| | | | |
|---|---|---|---|
| 4,981,810 | 1/1991 | Fazan et al. | 357/23.6 |
| 5,015,595 | 5/1991 | Wollesen | 437/41 |
| 5,037,777 | 8/1991 | Mele et al. | 437/228 |
| 5,049,517 | 9/1991 | Liu et al. | 437/919 |
| 5,071,781 | 12/1991 | Seo et al. | 437/60 |
| 5,071,783 | 12/1991 | Taguchi et al. | 437/60 |
| 5,128,273 | 7/1992 | Ema | 437/47 |

FOREIGN PATENT DOCUMENTS

| | | | |
|---|---|---|---|
| 0388075 | 9/1990 | European Pat. Off. | 437/43 |
| 1-122149 | 5/1989 | Japan | 437/919 |
| 2-52437 | 2/1990 | Japan | 437/40 |
| 2-152274 | 6/1990 | Japan | 437/52 |
| 2-246150 | 10/1990 | Japan . | |

OTHER PUBLICATIONS

Ema et al. "3-Dimensional Stacked Capacitor Cell for 16M and 64M DRAMS" IEDM, 1985 pp. 592-595.
Inoue et al. "A Spread Stacked Capacitor (SSC) Cell for 64MBit DRAMS," IEDM, Dig. Tech. Papers, pp. 31-34, 1989.

Primary Examiner—Olik Chaudhuri
Assistant Examiner—Loc Q. Trinh
Attorney, Agent, or Firm—David J. Paul

[57] ABSTRACT

A stacked v-cell (SVC) capacitor using a modified stacked capacitor storage cell fabrication process. The SVC capacitor is made up of polysilicon structure, having a v-shaped cross-section, located at a buried contact and extending to an adjacent storage node overlaid by polysilicon with a dielectric sandwiched in between. The addition of the polysilicon structure increases storage capability 70% without enlarging the surface area defined for a normal stacked capacitor cell.

10 Claims, 7 Drawing Sheets

STACKED V-CELL CAPACITOR USING A DISPOSABLE OUTER DIGIT LINE SPACER

FIELD OF THE INVENTION

This invention relates to semiconductor circuit memory storage devices and more particularly to the design of three-dimensional stacked cell capacitors used in high-density dynamic random access memory (DRAM) arrays.

BACKGROUND OF THE INVENTION

In dynamic semiconductor memory storage devices it is essential that storage node capacitor cell plates be large enough to retain an adequate voltage level in spite of parasitic capacitances and noise that may be present during circuit operation. As is the case for most semiconductor integrated circuitry, circuit density is continuing to increase at a fairly constant rate. The issue of maintaining storage node capacitance is particularly important as the density of DRAM arrays continue to increase for future generations of memory devices.

The ability to densely pack storage cells while maintaining required storage capabilities is a crucial requirement of semiconductor manufacturing technologies if future generations of expanded memory array devices are to be successfully manufactured.

One method of maintaining, as well as increasing, storage node size in densely packed memory devices is through the use of "stacked storage cell" design. With this technology, planarized layers of a conductive material such as polycrystalline silicon (polysilicon or poly) are deposited over an access device on a silicon wafer with dielectric layers sandwiched between each poly layer. A cell constructed in this manner is known as a stacked capacitor cell (STC). Such a cell utilizes the space over the access device for capacitor plates, has a low soft error rate (SER) and may be used in conjunction with inter-plate insulative layers having a high dielectric constant.

However, it is difficult to obtain sufficient storage capacitance with a conventional STC capacitor as the storage electrode area is confined within the limits of its own cell area. Also, maintaining high dielectric breakdown between poly layers in the STC capacitor becomes a major concern once insulator thickness is appropriately scaled.

A paper submitted by T. Ema, S. Kawanago, T. Nishi, S. Yoshida, H. Nishibe, T. Yabu, Y. Kodama, T. Nakano and M. Taguchi, entitled "3-DIMENSIONAL STACKED CAPACITOR CELL FOR 16M AND 64M DRAMS," IEDM, Dig. Tech. Papers, pp. 592-595, 1988, herein incorporated by reference, discusses a 3-dimensional stacked capacitor fin structure.

The fin structure and its development is shown in FIG. 1, pp. 593 of the article mentioned above. The storage node is formed by two polysilicon layers, called fins, with gaps between the fins (the number of fins can be increased, but is limited by design rules used). Capacitor dielectric film surrounds the whole surface of the fins with polysilicon (used for a capacitor cell plate) covering the fins and filling in the gaps. This design can be fabricated using current methods and increases storage capacitance, but it is not suitable for a deep submicron (such as 0.2 micron) design rule DRAM cell because the total thickness of several fins and cell plate is much larger than minimum feature size. The process flow, needed to realize this fin structure, requires precise alignment between two adjacent word lines and digits lines. This alignment along with the requirement to have the storage node poly overlap the storage node contact leads to a larger cell area that is not suitable for 0.2 micron design rules mentioned previously.

Also, in a paper submitted by S. Inoue, K. Hieda, A. Nitayama, F. Horiguchi and F. Masuoka, entitled "A SPREAD STACKED CAPACITOR (SSC) CELL FOR 64 MBIT DRAMS," IEDM, Dig. Tech. Papers, pp. 31-34, 1989, herein incorporated by reference, discusses a storage electrode of a 1st memory cell being expanded to the neighboring 2nd memory cell area.

The SSC cell fabrication process (refer to FIG. 2 pp. 32) begins with a storage electrode deposited above the digit lines that is expanded from the 1st memory cell to its adjacent memory cells and visa versa. This results in a stacked capacitor arrangement where each storage electrode can occupy two memory cell areas, thus almost doubling the storage capacitance of one memory cell.

However, the SSC process is complicated and adds at least two masks to the standard process and cannot be made with self-aligned contacts.

The present invention develops an existing stacked capacitor fabrication process to construct a three-dimensional stacked capacitor cell by using self aligned contacts without additional photolithography steps.

SUMMARY OF THE INVENTION

The invention is directed to maximizing storage cell surface area in a high density/high volume DRAM (dynamic random access memory) fabrication process. An existing stacked capacitor fabrication process is modified to construct a three-dimensional stacked V-cell (SVC) capacitor defined as a storage cell.

After a silicon wafer is prepared using conventional process steps, the present invention develops the SVC by creating a v-shaped poly structure conforming to the topology formed by three adjacent word lines running perpendicular to two adjacent digit lines, which results in increased capacitor plate surface area for each storage cell. Such a structure has the potential to increase the capacitance of a conventional STC cell by 70%.

The invention will allow the maintenance of adjacent capacitance within a DRAM cell as geometries are dramatically shrunk.

DETAILED DESCRIPTION OF THE PREFERRED EMBODIMENT

The invention is directed to maximizing storage cell surface area in a high density/high volume DRAM fabrication process, in a sequence shown in FIGS. 1–9.

A silicon wafer is prepared using conventional process steps up to the point of defining a cell array. Capacitor fabrication will now follow.

The capacitor of each cell will make contact with a buried contact within the cell, while the capacitor will extend to the active area of an adjacent cell. Each active area within the array is isolated from one another by a thick field oxide and arranged in interdigitated columns and non-interdigitated rows. The active areas are used to form active MOS transistors that can be doped as NMOS or PMOS type FETs depending on the desired use.

Figure 1:
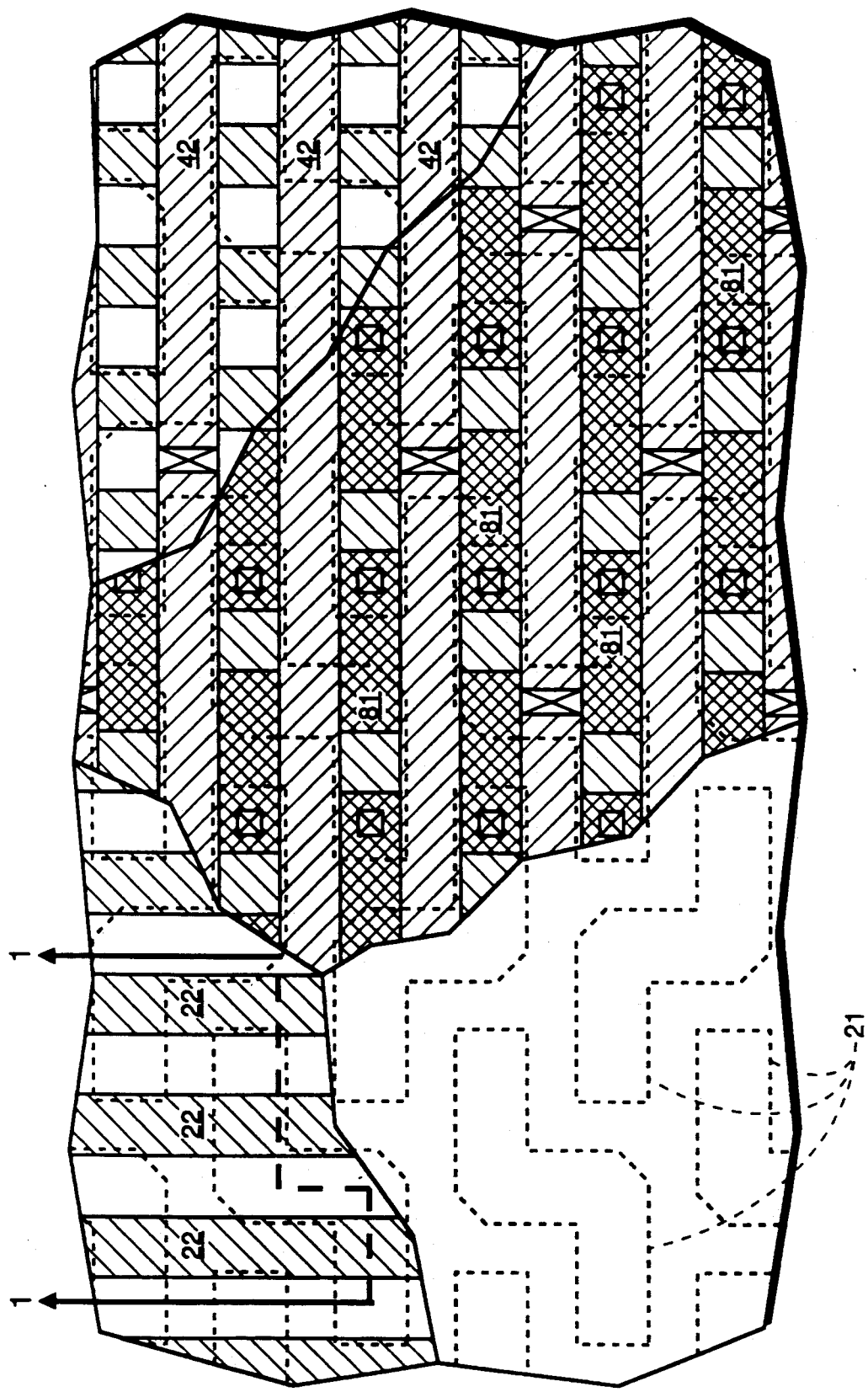
FIG. 1 is a top planar view of a portion of an in-process wafer showing digit lines, word lines, active areas and storage capacitors.

FIG. 1 shows a top planar view portion of a completed multilayered memory array with the main building blocks comprising digit lines 42, word lines 22, active area 21, and an SVC storage node plate 81. Active areas 21 have been implanted in such a manner as to have each adjacent active area interweave with one another in the row direction (defined by parallel word lines 22) thereby forming parallel interdigitated rows of active areas 21. In the column direction (defined by parallel digit lines 42) each adjacent active area 21 run end to end thereby forming parallel non-interdigitated columns of active areas 21. The stacked capacitor structure of the preferred embodiment (the SVC) is self-aligned to and over the top of word lines 42 as well as to digit lines 22.

Figure 2:
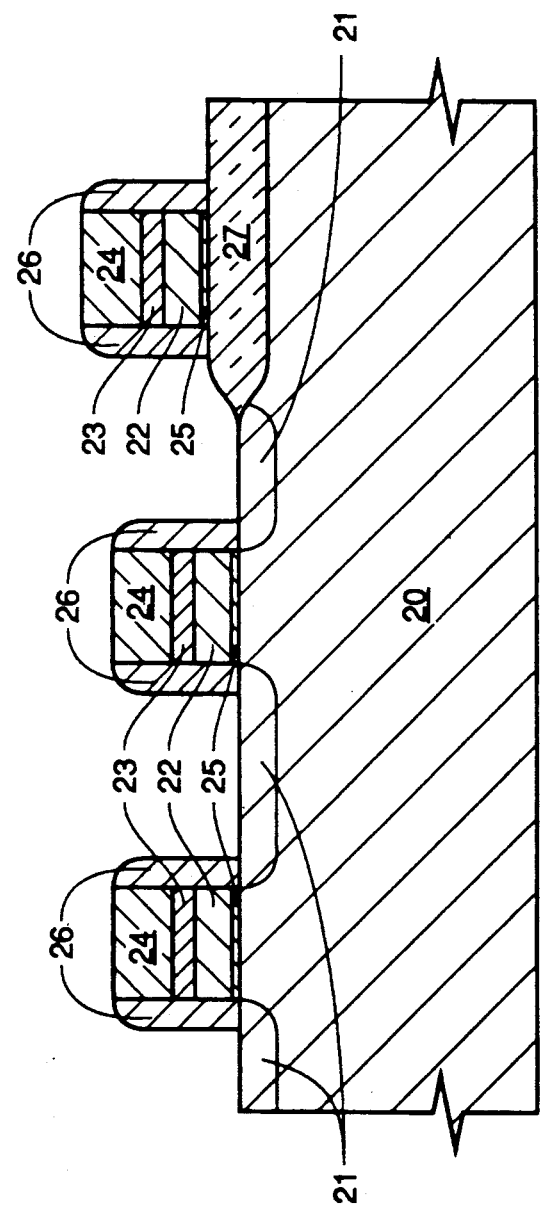
FIG. 2 is a cross-sectional view through broken line 1—1 of FIG. 1.

As shown in FIG. 2, parallel poly word lines 22, covered with silicide 23 and dielectric 24 (either oxide or nitride) and further isolated from subsequent conductive layers by dielectric spacers 26 (either oxide or nitride), have been previously deposited over a thin layer of gate oxide 25 or a thick layer of field oxide 27. Active areas 21 have been appropriately doped to a desired conductivity type which penetrates into the bulk silicon wafer 20, by conventional process steps. Now the wafer is ready for digit line formation that will run perpendicular to and over the top of the word lines 22.

Figure 3:
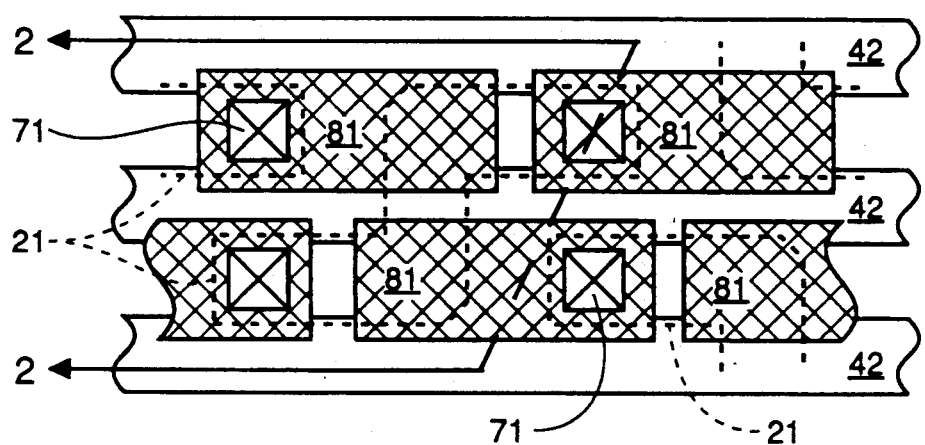
FIG. 3 is a top planar view of a portion of an in-process wafer showing active areas digit lines, storage node contacts and storage capacitors.

FIG. 3 shows a top planar view of a portion of an in-process wafer showing digit lines 42, storage node contacts 71, active areas 21 and storage node plates 81.

Figure 4:
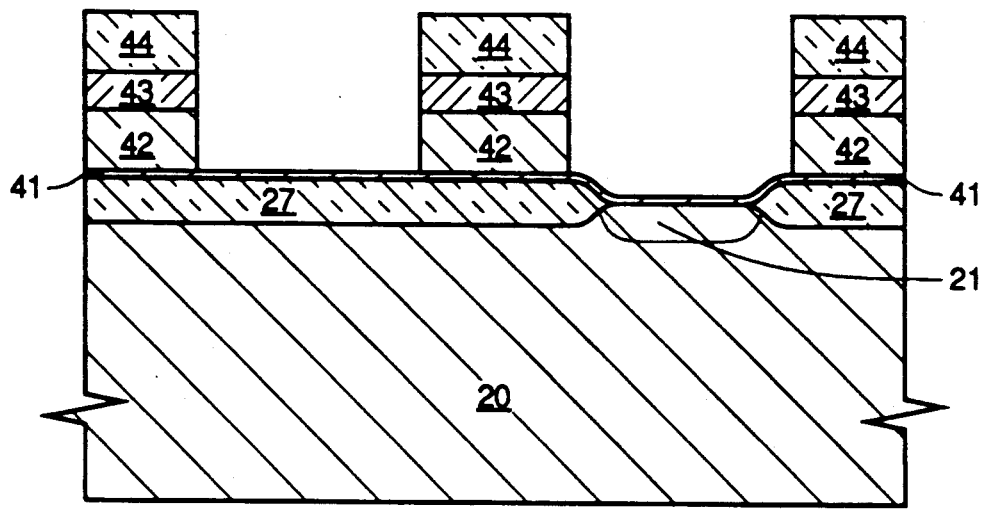
FIG. 4 is a cross-sectional view of the in-process wafer through broken line 2—2 of FIG. 3 following a patterning and etching of digit lines.

As shown in FIG. 4, an oxide layer 41 is deposited over the entire wafer array surface followed by a blanket deposition of polysilicon 42, silicide 43 and dielectric 44, respectively. In the preferred embodiment, dielectric 44 is oxide, but it could be either nitride or oxide that is deposited by chemical vapor deposition (CVD) which is preferred for its excellent conformity. The layers of polysilicon 42, silicide 43 and dielectric 44 are patterned and etched with polysilicon 42, previously being conductively doped, in conjunction with silicide 43 to serve as parallel digit lines 42 covered with dielectric layer 44. Digit lines 42 run perpendicular to word lines 22 (shown in FIG. 2) and conform to the wafer surface resulting in a waveform-like topology running in both the digit line and word line directions.

Figure 5:
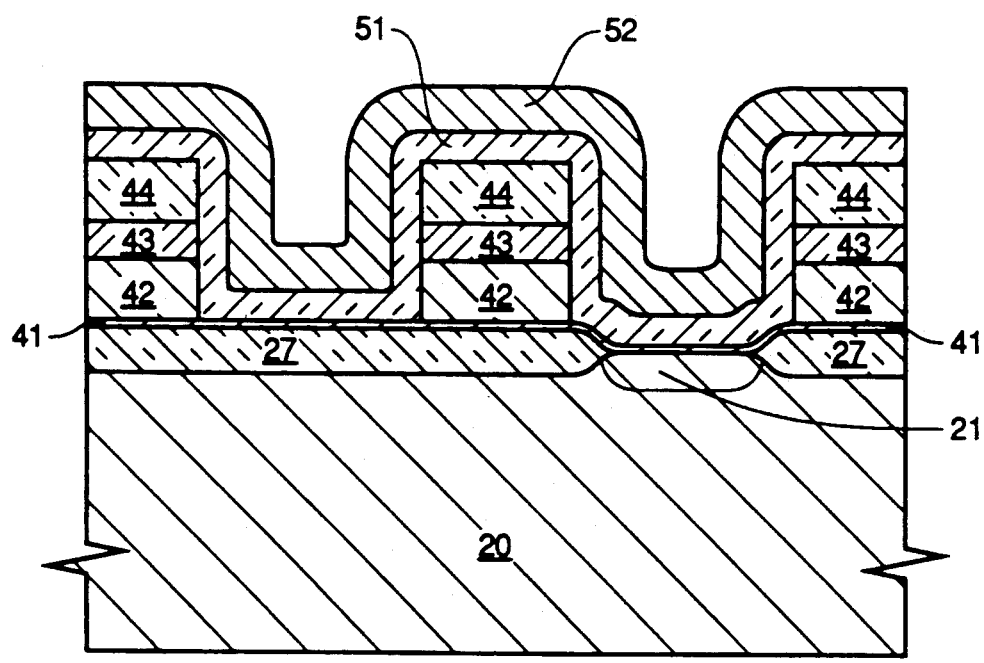
FIG. 5 is a cross-sectional view of the in-process wafer portion of FIG. 4 following conformal deposition of dielectric.

Up to this point, process flow has followed that of an array comprising conventional stacked capacitor cells. From this point forward, the process is unique to an array having SVC-type storage capacitors. As shown in FIG. 5, dielectric layers of oxide 51 and nitride 52 is now deposited.

Figure 6:
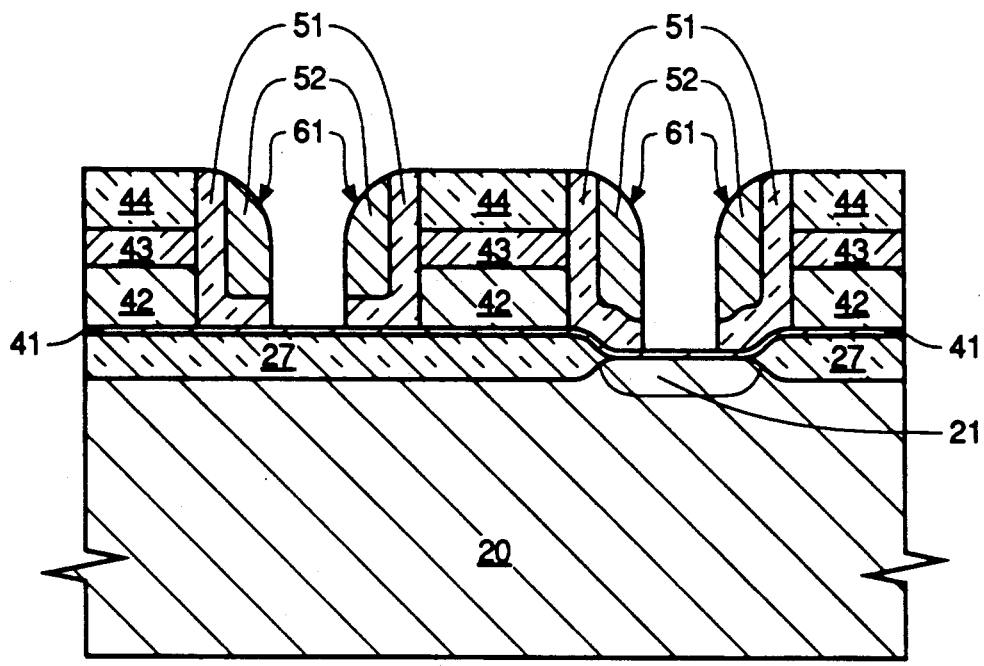
FIG. 6 is a cross-sectional view of the in-process wafer portion of FIG. 5 following etching of digit line spacers.

FIG. 6 shows dielectric digit line spacers 61, formed from oxide 51 and nitride 52, following an anisotropic plasma etch that stops when oxide 41 is reached.

Figure 7:
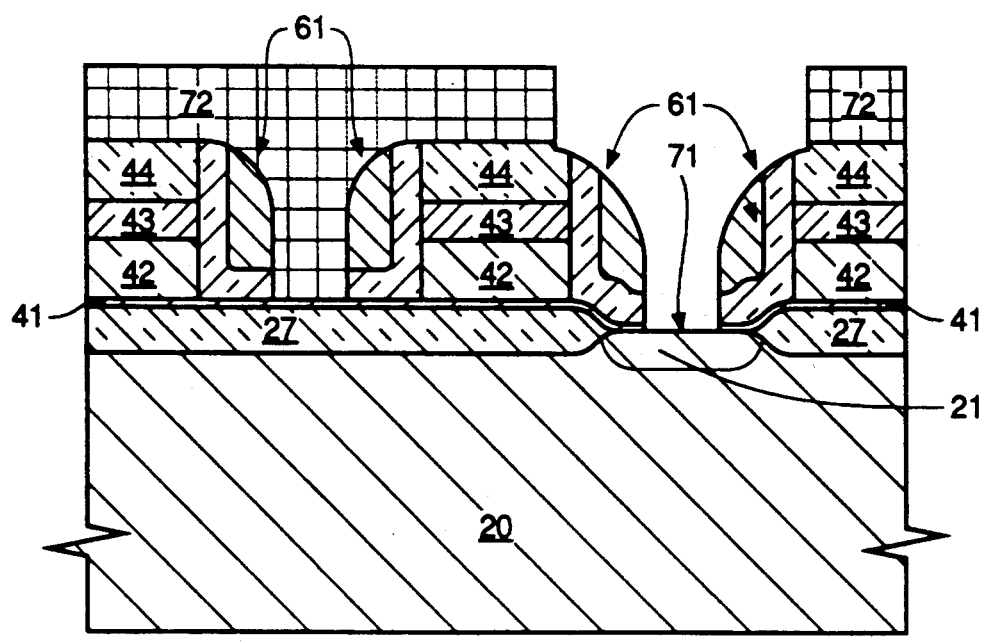
FIG. 7 is a cross-sectional view of the in-process wafer portion of FIG. 6 following a buried contact photo and etch.

As shown in FIG. 7, a buried contact 71, self-aligned to digit lines 42 by the presence of spacers 61, is located by covering all areas other than contact 7 with photoresist 72. After applying an appropriate photomask, a buried contact anisotropic etch on the exposed dielectric provides an opening to locate contact 71.

Figure 8A:
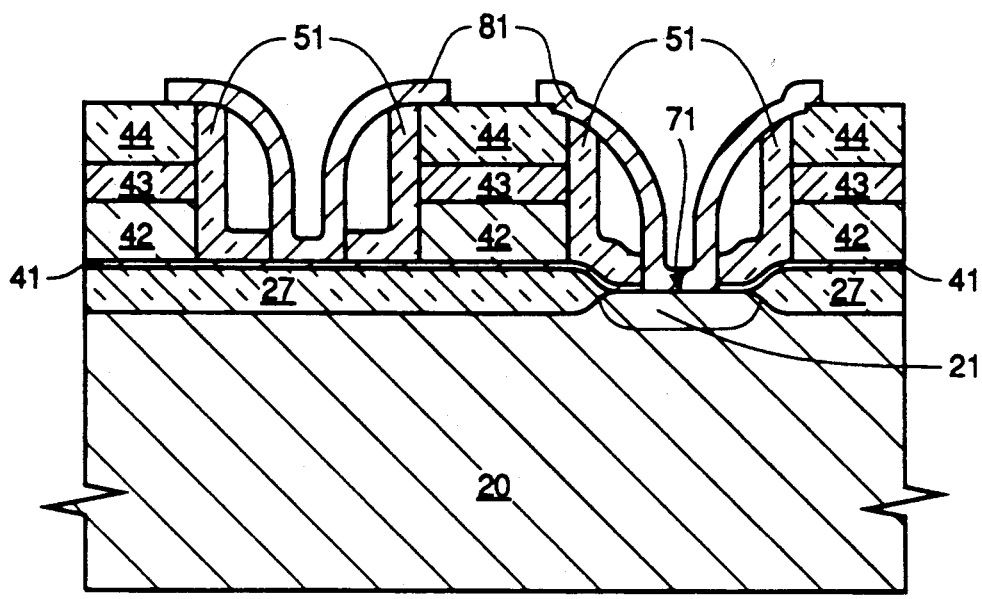
FIGS. 8a and 8b are cross-sectional views of the in-process wafer of portion of FIG. 5 following a photoresist strip, a nitride spacer etch, a blanket deposition of conformal poly followed by poly doping and patterning of a poly storage node.

As shown in FIG. 8a, the photoresist has been stripped and a conformal poly layer 81 is deposited, preferably by low temperature deposition, over the entire array surface and couples to active area 21 via buried contact 71. The low temperature deposition causes poly layer 81 to have a rugged textured surface that potentially doubles the surface area of poly layer 81. Poly layer 81 is conductively doped and patterned to serve as a bottom plate 81 of the SVC storage capacitor. Plate 81 extends over an adjacent poly word line (the word line is not shown as it runs parallel to cross-sectional views of FIG. 7) and continues to the next adjacent word line. Plate 81 conforms to the two perpendicular waveform-like topology (created after digit line formation) which run in both the word lines and the digit lines directions.

Following poly 81 patterning, a controlled wet etch is performed to remove nitride 52 from under poly 81, in preparation for deposition of an isolation layer which will serve as a capacitor dielectric. A time controlled nitride etch using phosphoric acid is the preferred method.

Figure 8B:
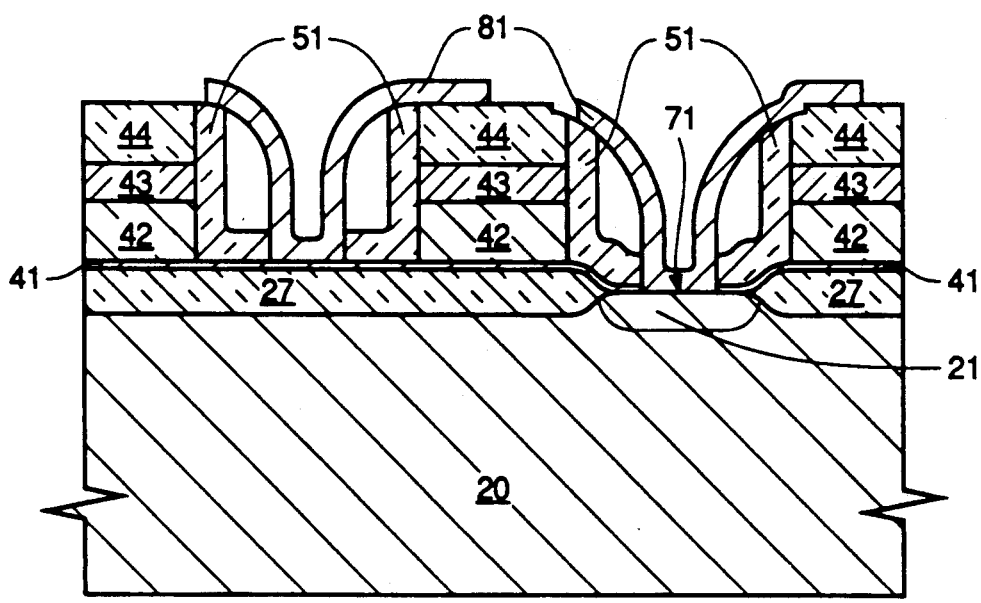

FIG. 8b represents a slight misalignment storage-node contact 71 with respect to digit line 42. In this case one wing of the v-shaped cross-sectional plate 81 is left free standing following the etching of nitride 52. Because poly plate 81 need not completely overlap contact 71, cell size can be reduced for a given photolithography critical dimension capability. Defects, such as the free standing wing, can be minimized with proper alignment tolerances.

Figure 9:
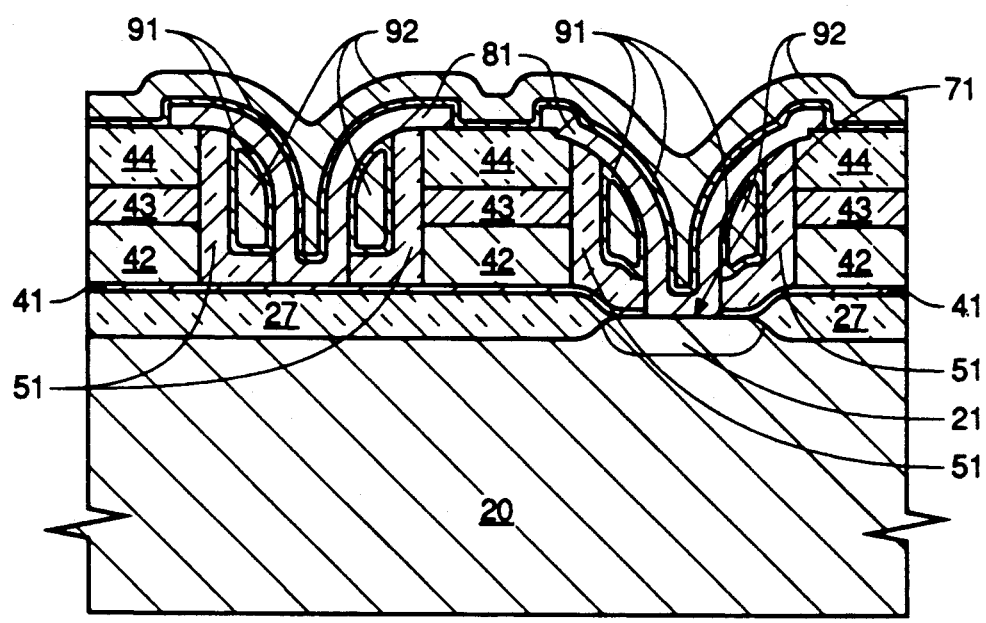
FIG. 9 is a cross-sectional view of the in-process wafer of portion of FIG. 8a following blanket depositions of conformal nitride and poly.

As shown in FIG. 9, a dielectric layer of nitride 91 is deposited that conforms to both the inside and outside surfaces of plate 81. Following nitride 91 deposition, a blanket deposition of conformal poly 92 is preformed that is conductively doped to serve as a top poly capacitor cell plate 92 of the SVC storage capacitor which also becomes a common cell plate to all SVC storage capacitors in the array.

With the addition of poly plate 81 as the storage node plate along with top capacitor cell plate 92 that surrounds plate 81, substantial capacitor plate surface area is gained at the storage node. Since capacitance is mainly effected by the surface area of a capacitor's cell plates the additional area gained by a 3-dimensional SVC structure can provide an additional 70% increase in capacitance over that of a conventional STC capacitor, without more space than that required for defining a stacked capacitor storage cell. The use of rugged poly for plate 81 can potentially double the overall capacitance of the storage cell.

It is to be understood that although the present invention has been described with reference to a preferred embodiment, various modifications, known to those skilled in the art, may be made to the structures and process steps presented herein without departing from the invention as recited in the several claims appended hereto.

We claim:

1. A process for fabricating a DRAM storage capacitor on a silicon substrate having active areas, word lines and digit lines, said process comprising the steps of:
    forming a first insulating layer superadjacent existing substrate surface having a waveform-like topology;
    forming a second insulating layer superadjacent said first insulating layer;
    forming inner and outer spacers on walls of said digit lines from said first and second insulating layers, said outer spacers serving as disposable spacers;
    creating a self-aligned buried contact location at each said storage node junction in each said active area;
    forming a first conductive layer superadjacent said substrate surface assuming said waveform-like topology in response to existing topology, said first conductive layer making contact to said storage node junctions at said buried contact locations;
    patterning said first conductive layer to form a storage node plate at each said storage node junction, said storage node plate having a cross-sectional structure comprising a v-shaped structure residing inside a u-shaped structure;
    removing said disposable spacers;
    forming a cell dielectric layer adjacent and coextensive with said storage node plate and adjacent said array surface; and
    forming a second conductive layer adjacent and coextensive said cell dielectric layer to form a cell plate.

2. A process as recited in claim 1, wherein said first insulating layer is oxide and said second insulating layer is nitride.

3. A process as recited in claim 1, wherein said first insulating layer is nitride and said second insulating layer is oxide.

4. A process as recited in claim 2, wherein said oxide layer is TEOS.

5. A process as recited in claim 3, wherein said oxide layer is TEOS.

6. A process as recited in claim 1, wherein said first and second insulating layers are deposited by chemical vapor deposition.

7. A process as recited in claim 1, wherein said first and second conductive layer are doped polysilicon.

8. A process as recited in claim 7, wherein said first conductive layer is deposited by low temperature deposition.

9. A process as recited in claim 1, wherein said cell dielectric layer is nitride.

10. A process for fabricating a DRAM storage capacitor on a silicon substrate having active areas, word lines and digit lines, said process comprising the steps of:
    depositing a first oxide layer superadjacent existing substrate surface having a waveform-like topology;
    depositing a first nitride layer superadjacent said first oxide layer;
    etching said first oxide and said first nitride layers to form oxide and nitride spacers adjacent walls of said digit lines, said nitride spacers serving as disposable spacers;
    creating a self-aligned buried contact location at each said storage node junction in each said active area;
    depositing a first conductive polysilicon layer superadjacent said substrate surface assuming said waveform-like topology in response to existing topology, said first conductive polysilicon layer making contact to said storage node junctions at said buried contact locations;
    patterning said first conductive polysilicon layer to form a storage node plate at each said storage node junction, said storage node plate having a cross-sectional structure comprising a v-shaped structure residing inside a u-shaped structure;
    anisotropically etching said disposable spacers;
    depositing a cell dielectric layer adjacent and coextensive with said storage node plate and adjacent said array surface; and
    depositing a second conductive polysilicon layer adjacent and coextensive said cell dielectric layer to form a cell plate.

* * * * *